United States Patent [19]

Donohue et al.

[11] Patent Number: 4,871,919

[45] Date of Patent: Oct. 3, 1989

[54] ELECTRON BEAM LITHOGRAPHY ALIGNMENT USING ELECTRIC FIELD CHANGES TO ACHIEVE REGISTRATION

[75] Inventors: Thomas P. Donohue, Katonah; Fritz J. Hohn, Somers; George A. Sai-Halasz, Mount Kisco, all of N.Y.

[73] Assignee: International Business Machines Corporation, Armonk, N.Y.

[21] Appl. No.: 196,397

[22] Filed: May 20, 1988

[51] Int. Cl.$^4$ .............................................. H01J 37/00
[52] U.S. Cl. ........................... 250/491.1; 250/492.3; 250/492.2; 250/306; 250/398
[58] Field of Search ............... 250/491.1, 492.2, 492.3, 250/306, 310, 307, 398

[56] References Cited

U.S. PATENT DOCUMENTS

| | | | |
|---|---|---|---|
| 3,580,749 | 5/1971 | Simon et al. | 250/492.2 |
| 3,710,101 | 1/1973 | O'Keeffe et al. | 250/491.1 |
| 3,832,561 | 8/1974 | O'Keeffe et al. | 250/397 |
| 3,849,659 | 11/1974 | O'Keefe | 250/491.1 |
| 3,879,613 | 4/1975 | Scott et al. | 250/492.2 |
| 4,008,402 | 2/1977 | O'Keeffe et al. | 250/397 |
| 4,238,686 | 12/1980 | Chin et al. | 250/492.2 |

FOREIGN PATENT DOCUMENTS 58-130525  8/1983  Japan ................................. 250/492.2

Primary Examiner—Janice A. Howell
Assistant Examiner—John A. Miller
Attorney, Agent, or Firm—Sughrue, Mion, Zinn, Macpeak & Seas

[57] ABSTRACT

A system for the detection of features in a semiconductor wafer for registration. An E-beam scans across an insulator covered with a metallic layer. The high energy electrons penetrate and cause the generation of electron/holes pairs. The drift or migration can be sensed as a current, the intensity of which is a function of the applied field strength. The field strength is in turn varied by the topology of the feature or the presence of a junction in the device. Since the E-beam position is known, registration occurs by correlation with the underlying feature as it is mapped out by sensing variations in current. The feature may be an alignment mark or a device under construction on the wafer.

12 Claims, 1 Drawing Sheet

४,८७१,९१९

ELECTRON BEAM LITHOGRAPHY ALIGNMENT USING ELECTRIC FIELD CHANGES TO ACHIEVE REGISTRATION

BACKGROUND OF THE INVENTION

This invention relates to a method of providing alignment during electron beam lithography. In particular, it relates to a scheme by which localized changes in an electric field in a resist caused by a feature in a wafer are employed for purposes of achieving alignment. This change in field is utilized by scanning an electron beam across the wafer whereby changes in the induced current are sensed as a function of the location of the feature to provide for registration.

Electron beam (E-beam) lithography has been proposed in a variety of contexts for use in patterning circuits. With the use of VLSI technology. very small dimensions make E-beam lithography a candidate as a potential production tool. While E-beam explorations for purposes of experiments and determinations of feasibility have been reported in the literature.

(1) T. H. P. Chang, M. Hatzakis, A. D. Wilson, A. J. Speth, A. Kern, H. Luhn, "Scanning Electron Beam Lithography for Fabrication of Magnetic Bubble Circuits". IBM Journal of Research and Development, Vol. 20 No. 4, July 1976, pp. 376.

(2) P. J. Coane, P. Rudeck, L. K. Wang, F. J. Hohn, "Electron Beam/Optical Mixed Lithography at Half-Micron Ground Rule", Proceedings of Microcircuit Engineering '86 Interlaken, p. 133 H. W. Lehmann, Ch. Bleiker, North-Holland;

To date, a number of operational problems have inhibited wide-spread commercial realization of this tool. It has typically been used to practice a few patterning steps in a multi-patterning process. In the laboratory environment, E-beam tools have been used to pattern complete devices.

In forming a typical circuit, a multitude of masks are typically employed for the purpose of defining patterns used at various points in the production of the device. Each of the mask levels therefore defines a specific pattern which must be laid over the previously created pattern in a precise manner. This precise technique of positioning various levels is known as alignment. Depending on the techniques which are used in a particular chip fabrication process, all of the mask levels may be done by one technique or another. That is, the candidate techniques may be either E-beam or, optical processing for photolithography. Commonly, optical and E-beam lithography steps may be intermixed. The use of E-beam lithography provides alignment problems which are difficult and critical irrespective of whether the patterning is exclusively E-beam or mixed with another technique. Typically, for E-beam alignment, the location of specific marks, that is alignment marks in the wafers must be made. As the fabrication progresses with the layers being fashioned, it often becomes difficult to locate those alignment marks. That is, as more and more layers are deposited on top of each other, the alignment marks can become buried and hence, potentially unreadable. For example, during a single step of thick planarizing an underlayer in a multilayer resist structure may be necessary or, a thin blocking layer for ion implantation can bury the alignment marks.

A typical technique for locating buried alignment marks is by the detection of back-scattered electrons. In principle, the alignment marks of a sufficiently different back scattering yield from the background and thus they may be detected and observed. However, other considerations often limit the choice of alignment marks resulting in less back scattering contrast than desirable. Typically, an alignment mark is a trench in the silicon wafer which provides per se a back scattering signal.

Given that difficulty, the prior art has suggested a number of other techniques for enhancing the detection of alignment marks. U.S. Pat. No. 3,710,101 generates a well within insulating oxide layers. The well is provided of a selected shape and thickness with the thickness of the oxide at the bottom of the well being relatively thin. By this technique, when a direct current potential between metal coating over the oxide and the underlying silicon wafer is applied, current will flow when an aligning electron beam impinges in the well area in proportion to the area of the well impinged by the electron beam.

U.S. Pat. No. 3,832,560 employs a different type of indicator utilizing cathode luminescence techniques while U.S. Pat. No. 3,832,561 employes Schottky barriers. Finally, U.S. Pat. No. 3,849,659 provides another technique of employing back-scattered electrons. As can be appreciated, all of these techniques require special processing the substrate. In the case of the 101 reference, etching of the well into the oxide is necessary.

Consequently, there exists a need in this technology to define an alignment scheme which can be used in conjunction with E-beam lithography, that is commensurate with contemporary production techniques and does not require a significant amount of "real estate" on the chip for purposes of defining alignment patterns.

SUMMARY OF THE INVENTION

Given these deficiencies in the prior art, it is an object of this invention to provide a method of detecting features in substrates utilizing a registration current provided by the E-beam for purposes of alignment.

Thus, an object of this invention is to provide an alignment technique which does not depend on any particular beam shape, photocathode device or the like.

Another object of this invention is to provide for an E-beam registration scheme that may be used in a mixed lithography process.

A further object of this invention is to provide an E-beam alignment scheme that senses the induced current change in the device to provide for registration.

An important object of this invention is to provide for alignment to a device structure that is being fabricated and not provided specifically for the purpose of registration.

In accordance with this invention, a current which is induced by the E-beam in the insulating layers covering the wafer is monitored. Changes in the current which occur as the E-beam scans across the wafer thus, map out the underlying structure including any features such as device structures, junctions and alignment marks. Since the E-beam scan is computer controlled and the location of features is likewise known as fabrication proceeds, E-beam location can be correlated to features. Without any E-beam impingement, the current across the resist is essentially zero. The wafer itself acts as a conductor with an overlying resist acting as an insulator. If high energy electrons penetrate across the insulator, electron-hole pairs would be created. The drift/diffusion of the carriers can be sensed as a current. Such is denominated herein as the E-beam induced current. This current is a function of how many carriers are able to leave the insulator before recombining or being trapped. This in turn depends on the field in the insulator. Consequently, such a current is a strong function of the electric field in the insulator. In accordance with this invention, the field dependence of the E-beam induced current is employed to locate features for alignment.

Specifically, in accordance with this invention, the field is created for purposes of current detection by depositing a thin conductive film on top of the insulating layers covering the wafer. The wafer itself acts as a counterelectrode. Thus, when a voltage is applied between the film and the wafer a current meter is introduced in the loop. As the E-beam scans the surface, it encounters features in the wafer. Those features to a certain extent, inevitably alter the electric field strength across the insulator and are manifested as change in current. The alteration of the electric field strength is a function of the distance from the insulator to the topology of the feature or the presence of a material junction forming regions of a device. Signals representative of those features may be therefore positively detected. Such a technique of detection is scaled with layer thickness deposited on top of the alignment marks since all that is necessary is the application of a higher voltage when the alignment marks are buried deeper. The loss of secondary electrons in the layers over the marks is of no consequence.

In accordance with this invention, once the location of features has been made and the system then properly aligned, the writing of patterns through the thin metal film may immediately commence. Prior to development of the resist, all that is necessary is the simple removal of the metal film by chemical means and processing then continues as per normal routine. Also, in resist development processes known to date, the developer employed in situ removes the conductive layer, e.g. Aluminum. Consequently, no additional steps are necessary to practice this invention.

This invention will be described in greater detail by referring to the attached drawing and the description of the preferred embodiment that follows.

DESCRIPTION OF THE PREFERRED EMBODIMENT

Figure 1:
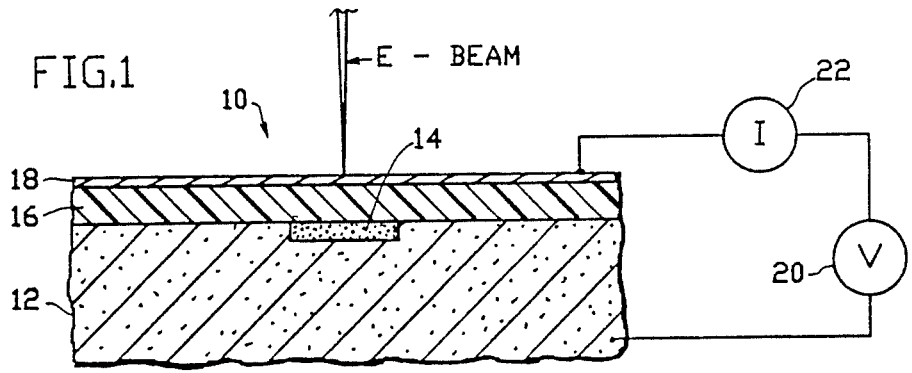
FIG. 1 is a schematic side view of a portion of a wafer illustrating the aspects of this invention.

Referring now to FIG. 1, a schematic view illustrates the principles of this invention. FIG. 1 illustrates a portion of a semiconductor wafer 10 comprising generally a silicon substrate 12 having processed therein a feature. This feature may be an alignment trench. It may be a topographic feature of a device or a junction, e.g. an electrical feature of a device being processed. In the context of the description of the preferred embodiment feature 14 will be assumed to be an alignment trench, it being understood that another feature could be employed. While the alignment trench 14 is illustrated as a single trench in the silicon substrate 12, it will be understood that in practice an array of alignment marks are placed at various locations on the wafer. Typically, those alignment marks are disposed at corners of the wafer. The alignment trenches themselves generally are nested as a series of elongated, generally parallel trenches arranged in pairs generally orthogonal to each other. FIG. 1 illustrates the wafer in a preliminary stage of device processing. On top of the silicon substrate 12 an insulator 16, typically an E-beam photoresist or the like, is applied. In accordance with one aspect of this invention a thin conductive layer 18, typically a metal film, is deposited onto the insulating layer 16. A voltage source 20 is then coupled to the wafer 12 and the metallic layer 18. A current meter 22 is placed in this circuit.

As illustrated in FIG. 1, an E-beam scans across the top of the wafer and in the process maps out the underlying structure including any alignment marks 14. The techniques of E-beam scan and control are well known and need not be discussed herein. Without any E-beam impingement, the current in the circuit illustrated in FIG. 1 is essentially zero across the insulator comprising the wafer 12. When the applied voltage is set correctly the electron hole pairs created by high energy electrons from the E-beam multiply and drift through the insulator 16. The drift/diffusion of those carriers within the insulator defines a current which can be sensed by the meter 22. This current is induced by the E-beam scan. This E-beam induced current is a function of the number of carriers able to leave the insulator 16 before recombining or being trapped. It is a function of the field in the insulator and therefore the current is dependent on the electric field in the insulator.

As illustrated in FIG. 1, a thin conductive material 18, generally a conductive metal, is deposited on the insulator 16. The wafer substrate 12 acts as a counterelectrode with the conductor 18 acting as a primary electrode. By applying a voltage from source 20 between the film 18 and the wafer 12, any alterations in electric field strength across the insulator 16 can be plotted as a change in current utilizing a meter 22 or other current sensor, plotter or computer interface. By correlation with the known location of the E-beam, registration can be obtained.

Figure 2:
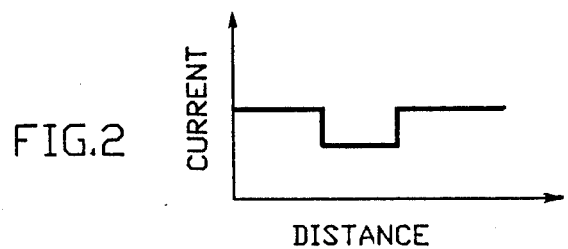
FIG. 2 is a plot of current as a function of scanning distance to illustrate a trace of current from a meter as a E-beam scans over a feature such as an alignment mark.

FIG. 2 illustrates a plot of the current from the meter 22 as the E-beam scans over the alignment mark. As illustrated, the change in the current occurs in the vicinity of the alignment mark 14. Since the steering of the E-beam is highly precise, the change of current can be mapped as a function of E-beam position on the wafer. This in turn permits the E-beam to begin writing from the same alignment point once the alignment mark has been detected.

EXAMPLE

A 5 um polyimide was coated on top of a silicon wafer having an etched alignment mark therein. 150 Angstrom of Aluminum was deposited thereon. A 350 volt potential Was placed across the polyimide. An E-beam scanned the surface of the metal layer and the E-beam induced current was observed when the E-beam scanned across the alignment trench.

As can be appreciated, using this technique, scaling is necessary since detection is a function of layer thickness deposited on top of the alignment marks, that is the thickness of the insulator 16. Should alignment marks be buried deeper, a higher voltage from source 20 is necessary. However, using this technique, the concern in prior techniques over the loss of backscatter electrons in layers over the marks is of no consequence.

This technique finds specific utilization in the fabrication of semiconductor devices processed to the point as illustrated in FIG. 1. This stage of manufacture is often encountered, that is the E-beam impingement directly on a photoresist layer which is a portion of the insulating layer across which the field is applied. In this situation, after location of the alignment marks, the user may simply immediately start writing patterns through the thin metal film using the sensed alignment marks as reference points. Prior to development of the resist layer 16, the metal film is simply removed by a chemical technique such as etching or other techniques which are well known. Processing then continues as usual to the next photoresist layer where the process is repeated.

This technique can be further simplified by eliminating the need to deposit metal film specifically for alignment purposes. That is, some manufacturing techniques employ a top surface conducting layer to prevent the resist from charging during E-beam exposure. This top layer conductor could therefore be used directly as the conductive layer in accordance with this method. A typical example of the discharged conductive material is 150 Angstrom of Al.

In some manufacturing processes, a specific photoresist is used which is not suitable, that is does not provide the necessary sensitivity for E-beam induced current detection. Such may happen in a case where the resist creates carriers which have too low mobility or if there is an excess of charge trapping. In those instances, an insulator may be used having optimum E-beam induced current characteristics only in E-beam alignment mark regions. The remainder of the wafer is then simply covered with a photoresist. This can be accomplished by the application of an extra, non-critically aligned optical masking step. In this step, the regions over the alignment mark are simply covered in a generalized manner.

In utilizing optical tools the alignment marks are visible and thus the user needs only to crudely line up a mask which contains electron beam marking patterns with interconnecting lines. The interconnecting lines facilitate the practice of this invention by not having to apply a voltage bias at many points. In delineated regions the insulator having good E-beam induced current properties and a conductive film on top of it is positive. The remainder of the wafer is covered with a standard E-beam resist such as PMMA. Following exposure, the E-beam photoresist is developed and the metal or other insulator is removed by chemical techniques. Depending on the properties of the insulator, the optical photoresist and the E-beam resist, it may be necessary in this situation to apply two optical masking steps prior to reaching the proper situation for E-beam alignment.

This technique provides greater resolution to that which is achieved in the prior art by merely sensing the presence of back-scattered electrons as a function of topography.

It is apparent that changes to this invention can be practiced without departing from the essential scope thereof.

Having defined our invention, we claim:

1. A method of determining the position of a buried feature in a semiconductor wafer having a surface covered by an insulative material comprising the steps of:
    moving an electron beam over said insulative material,
    impressing a voltage across said insulative material; and
    detecting variations in an induced current as said electron beam passes over said buried feature.

2. The method of claim 1, wherein said current is induced by said electron beam by the generation of electron-hole pairs in said insulative material which cascades as a function of an electrostatic field in said wafer.

3. The method of claim 1, further comprising the step of depositing a conductive material on said insulative material. wherein said insulative material is a photoresist.

4. The method of claim 1, further comprises the step of varying said voltage to scale said voltage as a function of the depth of said insulative material over said feature.

5. The method of claim 1, wherein said insulative material comprises a photoresist.

6. The method of claim 5, further comprising the step of applying an insulative material having electron beam induced current characteristics over said photoresist in regions where alignment marks are present.

7. The method of claim 2, further comprising the step of writing with said electron beam a pattern of data on said insulative material through said conductive material, removing said conductive material and developing said photoresist.

8. A system for the detection of a buried feature in a semiconductor wafer having a surface covered by an insulative material comprising:
    a circuit providing a voltage across said insulative material and said waver for generating electron-hole pairs in said insulative material, current sensing means in said circuit, and
    means for scanning an electron beam over said surface of said feature covered by said insulative material wherein said electron beam causes the generation of electrons that penetrate across said insulator creating electron-hole pairs, the drift/diffusion of which is a current detected by said circuit.

9. The system of claim 8, further comprising a conductive film deposited on said insulative layer.

10. The system of claim 8, wherein said semiconductor comprises a silicon wafer and said feature is a plurality of trenches, said trenches defining a matrix of alignment marks.

11. The system of claim 8, wherein said semiconductor comprises a silicon wafer and said feature is a portion of a device being fabricated in said wafer.

12. The system of claim 8, wherein said semiconductor comprises a silicon wafer and said feature is an electrical junction in a device being fabricated in said wafer.

* * * * *